United States Patent
Li et al.

(10) Patent No.: US 6,843,597 B1
(45) Date of Patent: Jan. 18, 2005

(54) METHOD AND APPARATUS OF A FAST TWO-LOOP AUTOMATIC GAIN CONTROL CIRCUIT

(75) Inventors: Don Li, Morganville, NJ (US); Gang Yang, Freehold, NJ (US)

(73) Assignee: Golden Bridge Technology Inc., West Long Branch, NJ (US)

( * ) Notice: Subject to any disclaimer, the term of this patent is extended or adjusted under 35 U.S.C. 154(b) by 786 days.

(21) Appl. No.: 09/854,620

(22) Filed: May 15, 2001

(51) Int. Cl.[7] .............................................. H04L 27/08
(52) U.S. Cl. .................................................... 374/345
(58) Field of Search ................................ 375/345, 316, 375/261; 327/323, 332; 330/254, 278; 455/136, 138, 137, 140, 182.3, 194.2; 341/139, 145, 156

(56) References Cited

U.S. PATENT DOCUMENTS 5,353,305 A * 10/1994 Fukuda et al. .............. 375/231
6,731,160 B1 * 5/2004 Behzad ....................... 327/559
2003/0171882 A1 * 9/2003 Thielman et al. ............. 702/64

* cited by examiner

Primary Examiner—Khai Tran
(74) Attorney, Agent, or Firm—McDermott Will & Emery LLP

(57) ABSTRACT

In a burst-mode, high-speed spread-spectrum communications system, faster convergence of a receiver's automatic gain control (AGC) circuit reduces the time required to bring a received signal within the operating range of an operation amplifier and other radio-frequency and digital sections of the receiving system. A gain control circuit includes a coarse-gain feedback loop and a fine-gain feedback loop to improve convergence speed and at the same time maintain the stability of the AGC circuit. The coarse-gain feedback loop quickly brings the received signal, using a large gain signal, to the desired operating range. The fine-gain feedback loop uses a smaller gain signal to gradually smooth the received signal to avoid saturation on the A/D converters.

26 Claims, 5 Drawing Sheets

Transmitter

METHOD AND APPARATUS OF A FAST TWO-LOOP AUTOMATIC GAIN CONTROL CIRCUIT

FIELD OF THE INVENTION

This invention is related to digital communications systems, and more particularly to a programmable, fast response and fast convergence automatic gain control (AGC) circuit for packet communication systems.

BACKGROUND

Mobile communication is becoming increasingly popular and the recent advances in digital processing have allowed a rapid migration of mobile services from analog communications to digital communications. Increasingly, development efforts are focusing on techniques for high-capacity communication of digital information over wireless links, and much of this wireless development work incorporates spread-spectrum communications technology.

Spread-spectrum is a method of modulation that spreads a data signal for transmission over a bandwidth, which substantially exceeds the data transfer rate. Direct sequence spread-spectrum involves modulating a data signal onto a pseudo-random chip sequence. The chip sequence is the spreading code sequence for spreading the data over a broad band of the spectrum. The spread-spectrum signal is transmitted as a radio wave over a communications media to a receiver. The receiver despreads the signal to recover the information data. The evolution of wireless communications to very high data rates with packet transmissions over the air has imposed constraints on the receiving system radio-frequency (RF) stages as well as on the operation of the analog-to-digital converters used therein.

Due to large variations in received signal power caused by propagation attenuation (e.g., fading due to man-made objects such as buildings or natural terrain features such as hills), a control mechanism is often used to dynamically control the gain of the receiving amplifier so that subsequent radio-frequency (RF) sections and digital sections of the receiving system can operate within a desired operating range. These sections include amplifiers, mixers, analog-to-digital converters and baseband analog or digital processing devices. The control mechanism for adjusting the amplification of the received signal level is referred to as automatic gain control (AGC).

An AGC circuit is designed to keep the amplified received signal at a near-constant power level over a large range of received signal levels. Three parameters involved in designing an AGC circuit include its operational range, its response time, and its steady-state error. The operational range of an AGC circuit in current spread-spectrum communications systems can easily exceed 80 to 90 dB in signal power. Some conditions that can contribute to this wide operating range include signal attenuation caused by hills or buildings and power control failure occurring when a mobile transmitter is in close proximity to a base station receiver.

Normally in dynamic control systems, the response time of the system is inversely related to its steady state error. As the control system parameters are configured and set to improve the system's response time, system instability, such as overshoot conditions, are likely to increase. In high data rate digital communications, and especially in packet switched systems, the conflict between these last two design parameters becomes increasingly important. In these types of systems, the data transmission interval can be as small as a fraction of a millisecond and even shorter. Because the start of each packet introduces a large signal variation and the periods of symbols within a packet are so short, a conventional AGC is not able to ensure timely amplification control for the received signal and, therefore, will prove ineffective at providing reliable data communications. Under these circumstances, a need, unmet by conventional AGC circuitry, exists for an AGC circuit that can quickly adjust the gain of a received signal during only a small period of time after a large received signal power fluctuation and can also provide smooth and stabilized operation during the remainder of data reception.

SUMMARY OF THE INVENTION

The present invention provides a fast AGC circuit through the use of a fine-gain feedback loop and a coarse-gain feedback loop to provide both the speed and control needed for high-speed digital communication systems. In addition, by utilizing circuits already present in a typical receiver and avoiding any redundant introduction of similar circuitry in each individual control loop, the inventive AGC circuit reduces both the size and cost of the hardware when compared to earlier systems.

Aspects of the present invention relate to a method for automatically varying a gain control signal in a receiver amplifier that has an adjustable gain value based on the gain control signal. In this method, an amplified received signal is quantized, and its power is measured. Next, the measured power is compared to a reference power to calculate an error signal and the magnitude of the error signal is compared to a threshold value to determine whether to use a fine-gain feedback loop or a coarse-gain feedback loop. If the magnitude of the error signal is greater than the threshold, then a loop with a large gain is selected, to speed-up the convergence. If the magnitude of the error signal is less than or equal to the threshold value, then a loop with a smaller gain is selected, to prevent saturation.

Other aspects of the present invention relate to an automatic gain control circuit for a receiver. The receiver includes a voltage controlled amplifier (VCA) that amplifies a received signal according to a gain control signal. A power meter measures the power of the amplified signal. A fine-gain loop multiplies the error signal by a fine-gain constant, and a coarse-gain loop multiplies the error signal by a coarse-gain constant. The values of the gain constants can be determined by experiments to suit a specific system operating environment. A feedback filter receives only one of the amplified error signals and provides it to the VCA amplifier for controlling its gain. The appropriate feedback loop signal is selected by a signal selector based on whether the magnitude of the error signal is less than or equal to the threshold value (the fine-gain feedback loop is selected) or is greater than the threshold value (the coarse-gain feedback loop is selected) to provide the gain control signal to the VCA amplifier for controlling its gain.

Further aspects of the present invention relate to a spread-spectrum transceiver having AGC circuitry and a method for including automatic gain control in a spread-spectrum receiver. The inventive devices and methods include a two-loop AGC circuit, as described above, having coarse and fine gain control that are selectively activated depending on whether the magnitude of the difference between the amplified received signal power and a reference power exceeds a predetermined threshold value.

Additional objects, advantages and novel features of the invention will be set forth in part in the description which follows, and in part will become apparent to those skilled in the art upon examination of the following and the accompanying drawings or may be learned by practice of the invention. The objects and advantages of the invention may be realized and attained by means of the instrumentalities and combinations particularly pointed out in the appended claims.

BRIEF DESCRIPTION OF THE DRAWINGS

The drawing figures depict preferred embodiments of the present invention by way of example, not by way of limitations. In the figures, like reference numerals refer to the same or similar elements.

DETAILED DESCRIPTION OF THE PRESENTLY PREFERRED EMBODIMENTS

Figure 1:
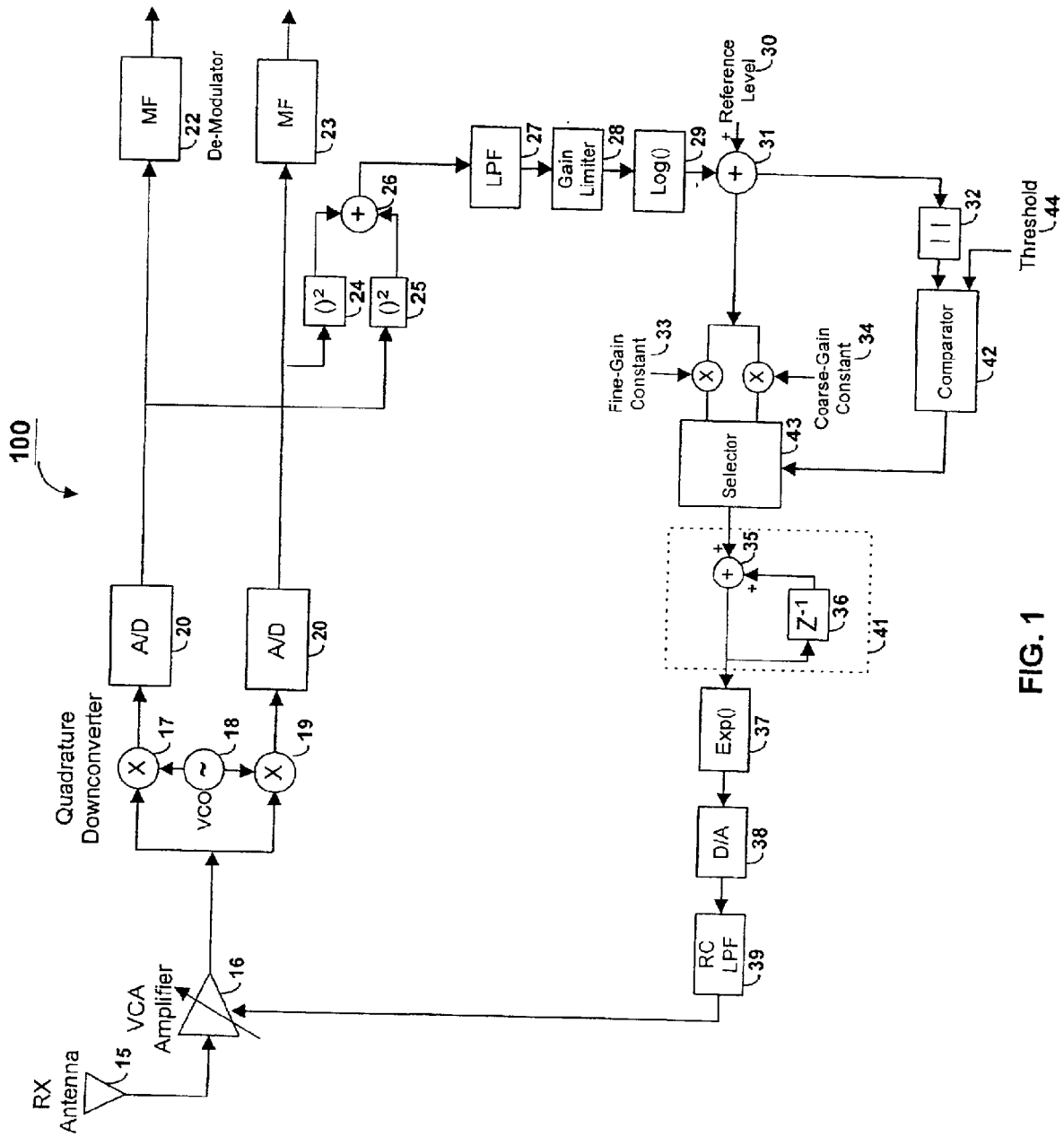
FIG. 1 illustrates a schematic of an automatic gain control circuit according to an embodiment of the present invention.

FIG. 1 illustrates an automatic gain control circuit 100 according to certain embodiments of the present invention for use with a receiver system or a transceiver system. While the AGC circuit 100 is described within the exemplary environment of a direct sequence spread-spectrum receiver, the present AGC circuit also has application to other types of receiver systems that would similarly benefit from fast, dynamic control of the amplification of the received signal. The present invention has benefit within a receiver of both base stations and mobile stations.

Previous efforts undertaken have investigated fast response AGC circuitry for high-speed communications systems. These previous efforts, however, involved generating coarse signal strength information from the analog received signal and producing finer control information from separate analog-to-digital converted signal inputs. The coarse and fine information were then used in combination with a look-up table to generate gain control signals for the receiver's front-end VCA amplifier.

The present AGC circuit 100, however, includes a fine-gain feedback loop and a coarse-gain feedback loop but, unlike previous attempts at providing two-loop controlled systems, the AGC circuit 100 utilizes common elements, such as A-to-D converters and filters, for both loops. Accordingly, the AGC circuit 100 provides two gain control loops, that improve AGC convergence speed without the increased size and cost that result from unnecessarily redundant circuitry.

In a preferred embodiment illustrated in FIG. 1, a multi-channel spread-spectrum signal is received at a receive antenna 15 and is amplified by a voltage controlled amplifier 16. In a spread-spectrum receiving system, the amplified signal is provided to frequency translators 17 and 19 which are supplied with in-phase and out-of-phase signal component of the local carrier by a voltage controlled oscillator (VCO) 18. As a result, a down-converted, multi-channel in-phase and out-of-phase baseband signal is forwarded to a respective one of the A/D converters 20 for analog-to-digital conversion. The converted in-phase signal is received at a matched filter 22 and the converted out-of-phase signal is received at a similar matched filter 23, where the signals are processed (discussed later with regard to FIG. 5).

The voltage controlled amplifier 16 has a variable gain that is adjustable according to a control signal. The remaining AGC circuit elements 24–44 are used to generate this control signal at an appropriate value.

The quantized signals from the A/D converters 20 are measured by power meters 24 and 25 averaged over a fraction of the spreading-symbol period and then summed as the received signal strength indicator (RSSI). In particular, the converted in-phase signal power is measured by meter 24 and the converted out-of-phase signal power is measured by meter 25. The power level of each of the quantized signals at a particular time is measured by squaring the respective signals and averaged over a fraction of the spread-symbol period. These measured powers from each signal are then summed by the adder 26 to determine the RSSI signal.

The RSSI signal is preferably filtered by a low-pass filter 27 which operates to smooth any abrupt signal variations of the RSSI signal. The smoothed RSSI signal is then limited by the gain limiter circuit 28. The gain limiter 28 includes a pre-set maximum RSSI value, $RSSI_{max}$, and a pre-set minimum RSSI value, $RSSI_{min}$. These constraining values permit the AGC circuit 100 to control the range of the RSSI signal that is forwarded on to the later circuit stages. For example, because the upcoming log( ) function has a singular point at 0, $RSSI_{min}$ can be set to some positive number to avoid the singularity. The pre-set values of $RSSI_{max}$ and $RSSI_{min}$ are adjustable depending on different receiver characteristics such as the desired AGC convergence speed and the required A/D resolution.

Next, the constrained RSSI signal is compressed by block 29 which performs the logarithm function on the signal. Compressing the RSSI signal by taking the logo is beneficial, because doing so reduces the range of values involved in the subsequent linear processing steps of the AGC control signal.

An error signal is then generated by subtracting the compressed RSSI signal from the preferred power level (i.e. a reference level 30) via subtractor 31. The magnitude of the resulting error signal provides an indication of the difference between the actual power level of the signal currently being received and a desired power level.

In the preferred embodiment, the error signal is then forwarded to a fine-gain and a coarse-gain multiplier. Specifically, the error signal is amplified by the fine-gain constant 33 and the coarse-gain constant 34. Along with the feedback filter 41, the coarse-gain constant 34 provides a feedback loop with a large gain control signal that quickly brings the multi-channel spread-spectrum signal near the operating range of the amplifier 16. Along with the feedback filter 41, the fine-gain constant 33 provides a feedback loop with a smaller gain control signal that gradually smoothes the received signal to the operating range of the A/D converters 20 while avoiding saturation.

The feedback filter 41 is a conventional feedback filter operating on a sampling clock. At each clock, the feedback filter adds at 35 the current output from either the coarse-gain amplified error signal at the output of multiplier 34 or the fine-gain amplified error signal at the output of the multiplier 33 to its previous output (i.e., the output of the filter 41 delayed by one clock time through delay element 36). This feedback filter operates to smooth the amplified error signal.

Selector circuit 43, which is an electronically controlled switch, selectively controls whether it is the fine-gain feedback loop signal or the coarse-gain feedback loop signal that is forwarded to control the gain of the amplifier 16. The control of the selector 43 for switching between the fine-gain and coarse-gain feedback loops is automatically controlled by a predetermined error threshold 44 that is adjustable to suit each individual receiver application.

The magnitude of the error signal from the subtractor 31 is measured by the absolute value lock 32. This error signal magnitude is then compared, via the comparator 42, to an error threshold value 44. The selective operation of selector circuit 43 varies according to the relationship between the error signal magnitude and the threshold value 44. As depicted in FIG. 1, if the magnitude of the error signal exceeds the threshold 44, then the selector 43 switches to the coarse-gain feedback loop; otherwise, the selector 43 switches to the fine-gain feedback loop. In operation, the fine-gain feedback loop is selected when the magnitude of the error signal and the threshold value 44 satisfy a first relationship (i.e., the magnitude of the error signal is less than or equal to the threshold) and the coarse-gain feedback loop is selected when the complimentary relationship between the two values is satisfied (i.e., the magnitude of the error signal is greater than the threshold).

Initially, when there is a large variation of signal power over the operating range of the receiver amplifier, the large gain factor in the coarse-gain feedback loop is applied to the received signal to bring the power level to the desired range. After that, a small gain factor is applied in the fine-gain feedback loop to smooth out some of the variations which might cause the A/D converter to saturate. The error threshold 44 determines when the AGC circuit switches to the fine-gain feedback loop from the coarse-gain feedback loop, and vice-versa. Furthermore, the fine-gain feedback loop with a small gain control signal stabilizes the feedback loop when the steady-state error signal is very small, such as when the AGC circuit actually reaches the steady-state.

The gain control signal, resulting from either the fine-gain or coarse-gain feedback loops, is then re-converted to a linear power by applying the exponential function, via circuitry 37, to the gain signal. The gain signal is then converted to an analog signal by the D/A converter 38 and smoothed by an RC low pass filter 39 to generate an amplifier gain control signal. This control signal adjusts the gain of the amplifier 16.

Figure 2A:
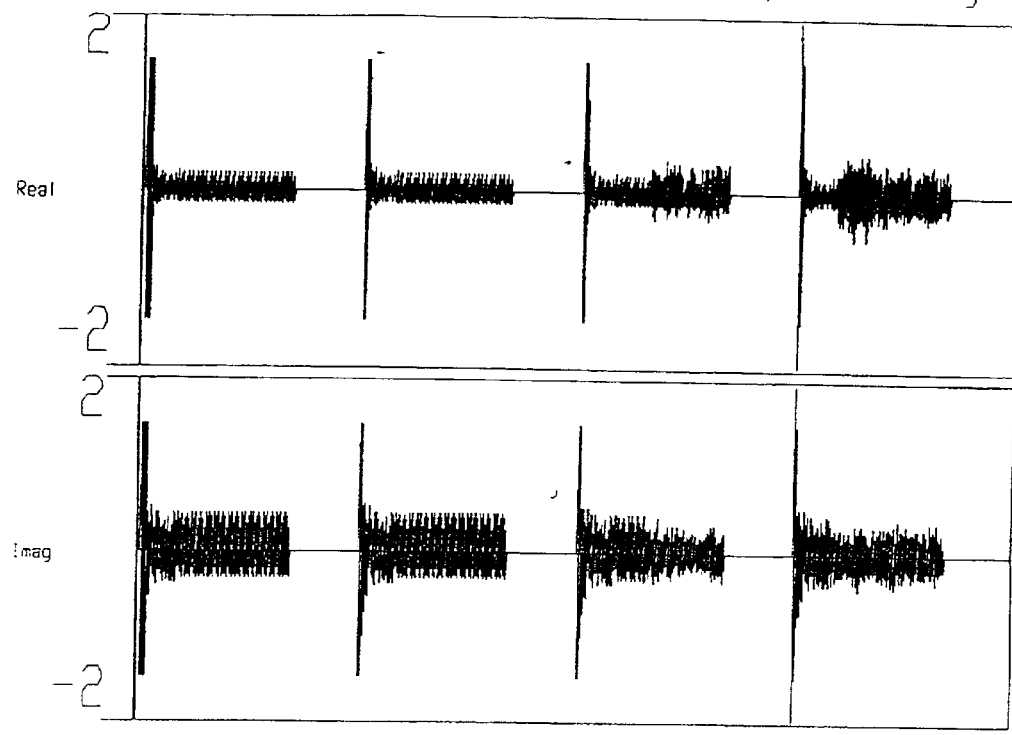
FIGS. 2A, 3A illustrate exemplary signal levels received by automatically gain controlled circuitry utilizing embodiments of the present invention.
Figure 2B:
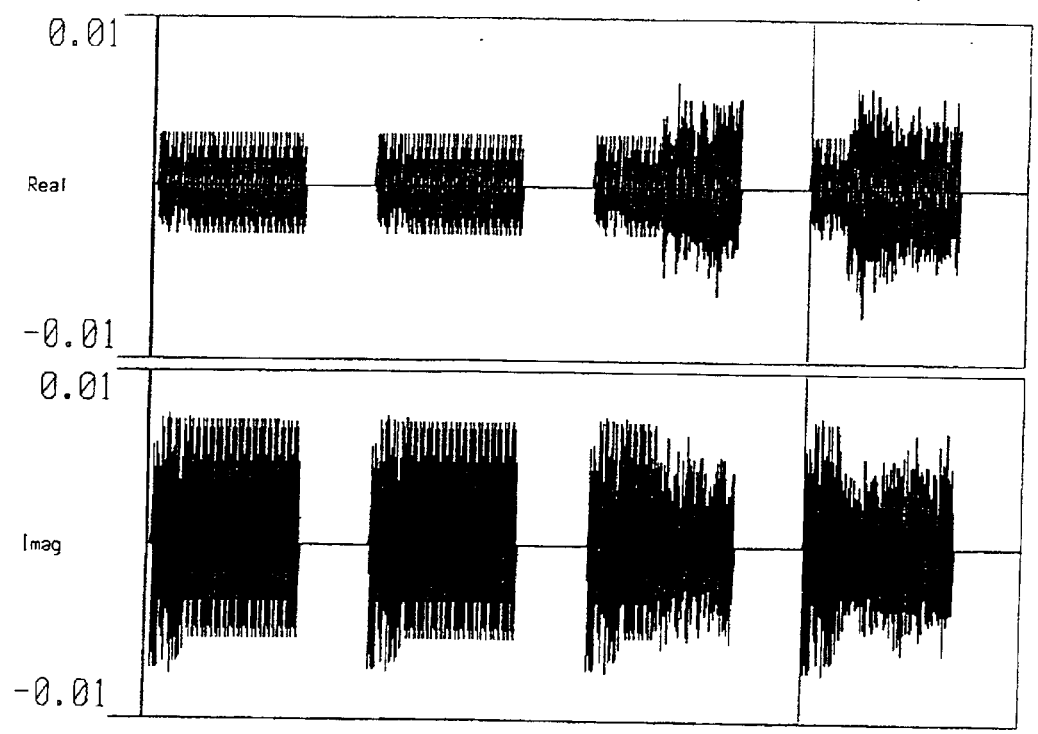
FIGS. 2B and 3B illustrate exemplary signal levels received before applying the automatically gain controlled circuitry utilizing embodiments of the present invention.

FIGS. 2A and 2B illustrate an AGC-controlled multi-channel spread-spectrum signal at a receiver utilizing an embodiment of the present invention. Each figure, which shows the amplified received signal corresponding to four different packets, depicts the in-phase signal on top and the out-of-phase signal on the bottom. As seen from FIG. 2A, the AGC-controlled signal has a set of spikes in the beginning of the packet, with this group of spikes having a duration of roughly one symbol. After such a short duration, the AGC-controlled signal quickly settles between the range of −1.5 volts to +1.5 volts without experiencing saturation. For comparison, conventional AGC circuits typically provide convergence times of between 40 and 50 symbol periods. FIG. 2B shows the received spread-spectrum signal which has been subjected to a 46 dB attenuation under Rayleigh fading.

Figure 3A:
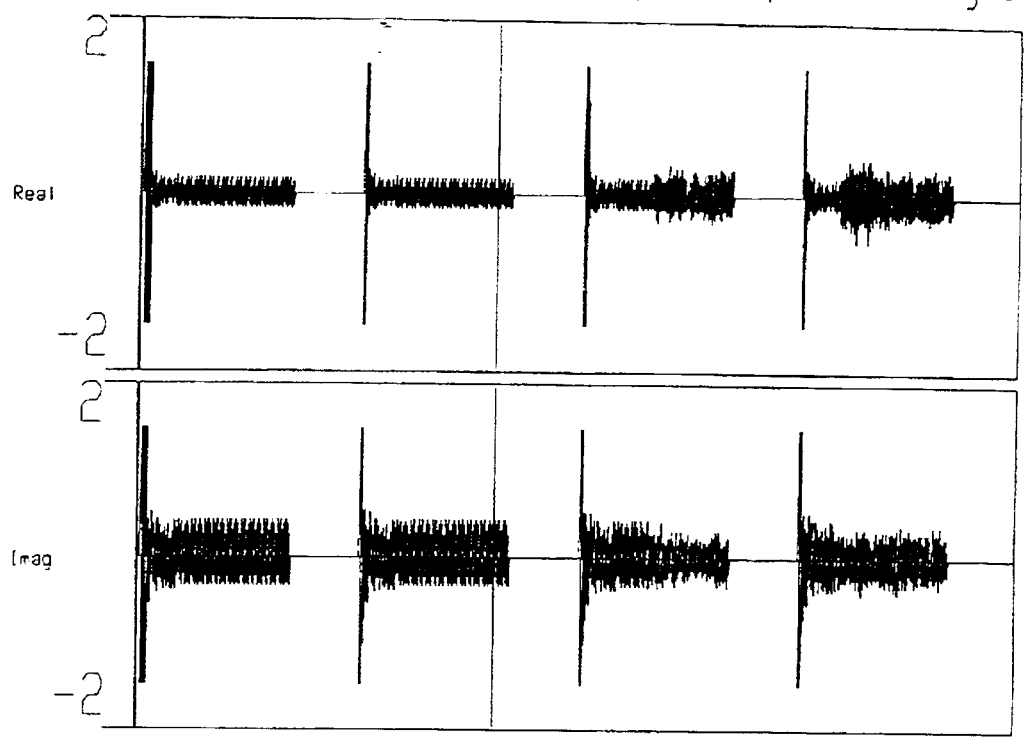
Figure 3B:
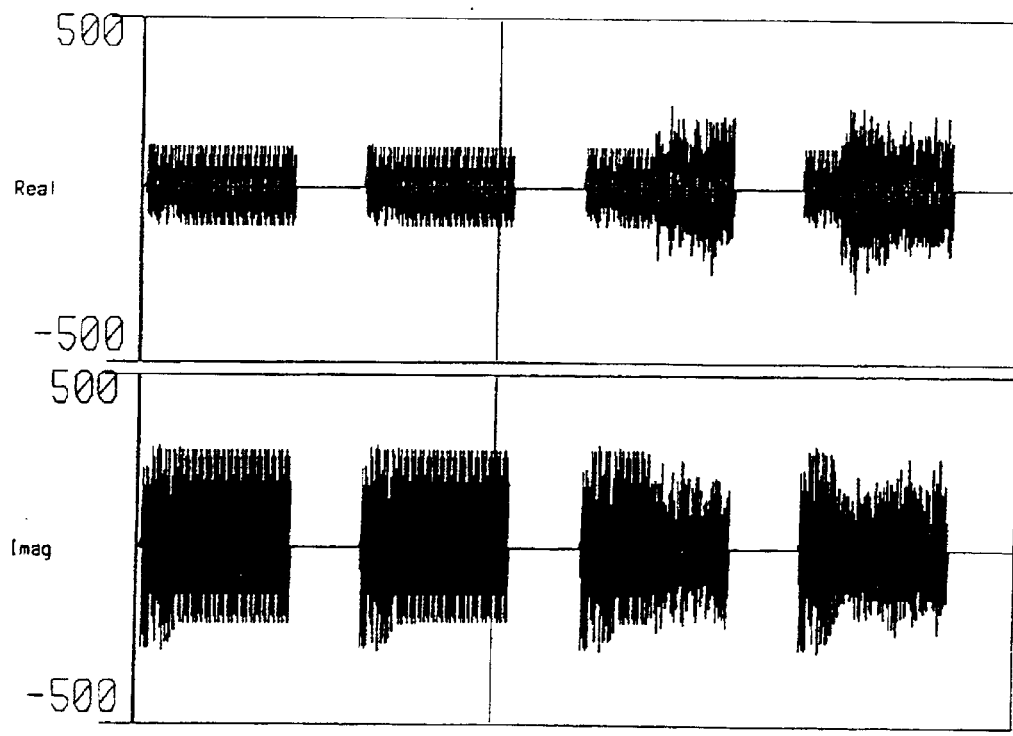

FIG. 3A illustrates the AGC-controlled multi-channel spread-spectrum signal when the received signal, shown in FIG. 3B, has been subjected to a 46 dB power surge under Rayleigh fading. Thus, in a Rayleigh fading environment, FIGS. 2A, 2B, 3A and 3B illustrate the dynamic range of the present inventive AGC circuit to be 92 dB.

Figure 4:
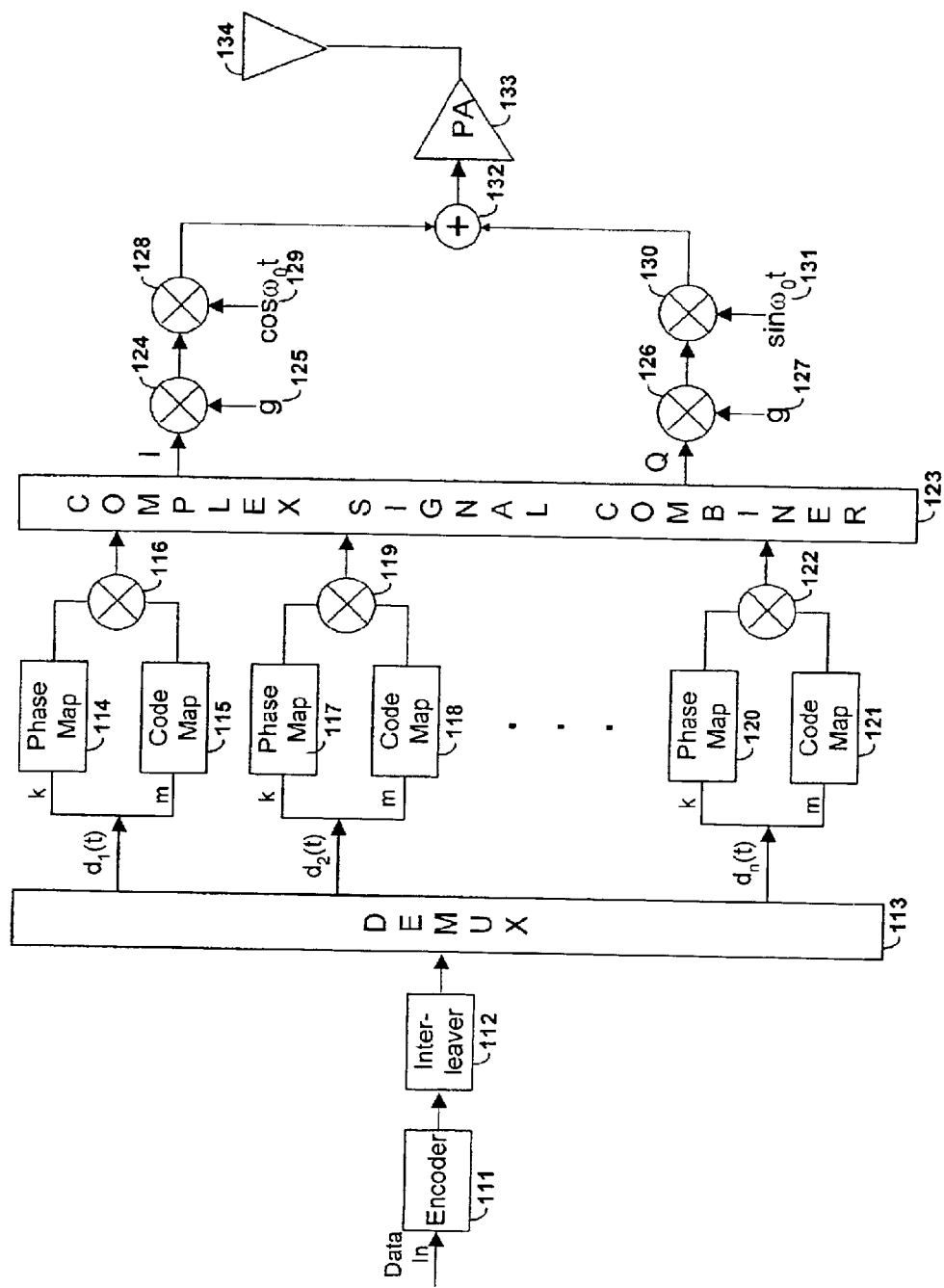
FIG. 4 illustrates an exemplary spread-spectrum transmitter in which embodiments of the present invention have application.
Figure 5:
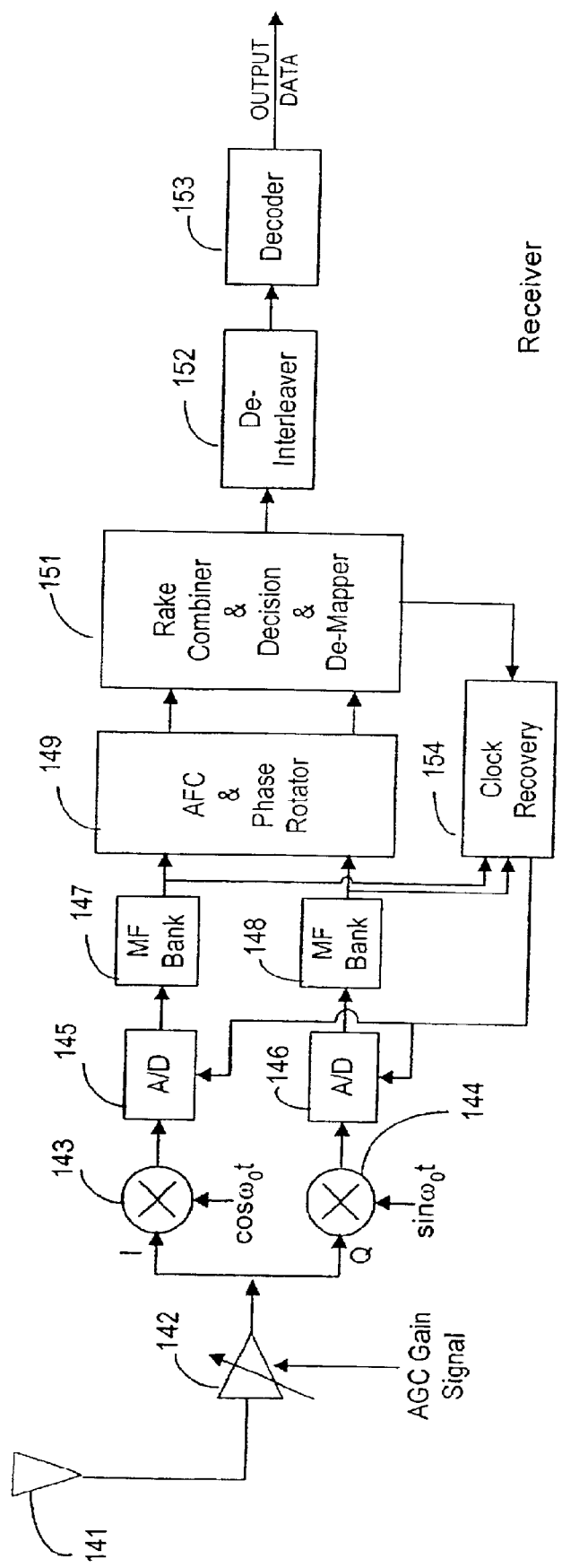
FIG. 5 illustrates an exemplary spread-spectrum receiver in which embodiments of the present invention have application.

The inventive AGC circuitry is particularly useful in a burst-mode, high-speed spread spectrum receiver. Accordingly, it may be helpful at this point to summarize the structure and operation of an exemplary spread spectrum communication system in general and the receiver in such a system in particular. FIG. 4 and FIG. 5 depict a spread-spectrum communications system transmitter and receiver respectively for providing high-speed service.

The transmitter section essentially includes the elements 111–134 shown FIG. 5. An encoder 111 receives input information data, for example at 28 Mbps. The encoder 111 performs error correction encoding, for example by application of a rate-1/2 convolutional code. The resultant encoded data at 56 Mbps is applied to an interleaver 112. At the output of the interleaver 112, the data stream is divided into a number of sub-channel data streams, by a demultiplexer 113. In this example, the data stream is split into n branches, $d_1(t)$ to $d_n(t)$.

Each sub-channel data sequence goes to an input of two mapper circuits e.g. the first sub-channel $d_1(t)$ goes to phase map 114 and code map 115. Each code map maps m bits of the sub-channel data sequence to a distinct one of the available code-spreading sequences. Each phase map maps k bits of the sub-channel data sequence to a distinct one of the available complex phasors. A multiplier 116 as in the first sub-channel modulates the chosen phasor on the mapped spreading sequence over the sequence symbol period. In a similar manner, the product device 119 multiplies each code sequence selected by the code map circuit 118 by the phasor selected by the phase map circuit 117, to form the spread spectrum signal for the second sub-channel. Similar devices perform the same functions for the other sub-channels; and so the product device 122 multiplies code sequences from selected by the code map circuit 121 by the corresponding phasors selected by the map circuit 120, to form the signal for the n-th sub-channel.

The complex signal combiner 123 algebraically combines the real or in-phase components of the spread-spectrum sub-channels from the product devices, to form an in-phase (I) multi-channel spread-spectrum signal. The complex signal combiner 123 algebraically combines the imaginary or quadrature components to form a quadrature (Q) multi-channel spread-spectrum signal. The resultant multi-channel spread-spectrum in-phase signal and quadrature signal is spread by a cell-site specific signature sequence 125 and 127 respectively, such as an extended Gold sequence (g). Multipliers 128, 130 modulate carrier-frequency signals 129, 131 generated by a local oscillator to shift the in-phase and quadrature signal to a radio frequency respectively. The transmitter also includes a summing device 132 and a power amplifier 133 for transmitting the combined signal over a communications channel via an antenna 134.

The receiver shown in FIG. 5 essentially comprises the elements 141–153. The receiver includes an antenna 141 for receiving the spread-spectrum signal transmitted over the air-link. A VCA amplifier 142 controlled by the inventive AGC circuit through the gain control signal provides low noise amplification of the analog signal from the antenna 141. For convenience, the AGC control loops have been omitted here. The AGC, however, would be implemented as shown, for example, in FIG. 1.

The VCA amplifier 142 supplies the channel signal to two translating devices 143 and 144. A local oscillator generates proper carrier-frequency signals and supplies a $\cos(\omega_0 t)$ signal to the device 143 and supplies a $\sin(\omega_0 t)$ signal to the device 144. The translating device 143 multiplies the amplified over-the-air channel signal by the $\cos(\omega_0 t)$ signal; and the translating device 144 multiplies the amplified over-the-air channel signal by the $\sin(\omega_0 t)$ signal. The translating devices 143 and 144 translate the received multi-channel spread-spectrum signal from the carrier frequency to the baseband.

The translating device 143 downconverts the spread-spectrum signal to the baseband and supplies the converted signal to an analog to digital (A/D) converter 145. Similarly, the translating device 144 downconverts the spread-spectrum signal to the baseband and supplies the converted signal to an analog to digital (A/D) converter 146. Each of the digital output signals is applied to a matched filter (MF) bank 147 or 148. Each matched filter bank 147, 148 utilizes a matrix of potential spreading codes as reference signals, for example to detect any one or more of all possible spreading codes, and correlate the signal on its input to identify the most likely matches. In this manner, each MF bank 147 or 148 selects the most probably transmitted code sequence for the respective channel.

The signals from the MF banks 147 and 148 are supplied in parallel to a processor 149, which performs automatic frequency correction (AFC) and phase rotation, and the outputs thereof are processed through a Rake combiner and decision/demapper circuit 11, to recover and remap the chip sequence signals and phasor signals to the original data sequences. The data sequences for the I and Q channels also are multiplexed together to form a data stream at 56 Mbps. This detected data stream is applied to a deinterleaver 152. The deinterleaver 152 reverses the interleaving performed by element 112 at the transmitter. A decoder 153 performs forward error correction on the stream output from the deinterleaver 152, to correct errors caused by the communication over the air-link and thus recover the original input data stream (at 28 Mbps).

The illustrated receiver also includes a clock recovery circuit 154, for controlling certain timing operations of the receiver, particularly the A/D conversions.

The present invention provides an improvement in the circuitry that generates the AGC gain control signal input to the VCA amplifier 142, as shown in the receiver of FIG. 5. In accord with the invention, the AGC gain control signal is provided by circuitry using two feedback loops that provide fast convergence and stable operation, as discussed in detail above, with respect to FIG. 1.

In the above-discussed example of FIG. 4 and FIG. 5, for simplicity, there was essentially one transmitter sending signal to one receiver. The actual application of the invention may involve multi-casting to multiple receivers. A preferred network, however, would include a number of cell-site base stations connected to a broadband packet network (not shown).

Each base station would include a transmitter and a receiver utilizing cell-site specific cover codes. A number of mobile stations would communicate with each base station. Within each cell, the mobile stations would access the base station in a time division manner. In a similar fashion, the cell site base station would transmit to each mobile station on a time division basis. In any two-way communication network, all stations would include a transmitter and a receiver. For example, both the base stations and the mobile stations in the cellular network would include a transmitter and a receiver, such as disclosed with regard to FIGS. 4 and 5. In both directions, the receiver would utilize one or more matched filters implemented in accord with the present invention.

Those skilled in the art will recognize that the spread-spectrum communication system of FIGS. 4 and 5 is but one example of a spread-spectrum system that may utilize a fast convergence AGC circuit, in accord with the invention. For example, the inventive AGC circuitry is similarly applicable to CDMA cellular receivers, in wideband CDMA receivers, TDMA receivers, etc.

FIG. 1 illustrates a preferred arrangement of the comparator and control circuitry for implementing selectable coarse and fine feedback loops. One of ordinary skill would easily recognize that alternative circuitry can accomplish the same function without departing from the scope of the present invention.

While the foregoing has described what are considered to be the best mode and/or other preferred embodiments of the invention, it is understood that various modifications may be made therein and that the invention may be implemented in various forms and embodiments, and that it may be applied in numerous applications, only some of which have been described herein. It is intended by the following claims to claim any and all modifications and variations that fall within the true scope of the invention.

What is claimed is:

1. A fast two-loop automatic-gain-control (AGC) method for automatically varying a gain control signal for a receiver's variable amplifier, comprising the steps of:

a) amplifying a received signal according to an adjustable gain value, wherein the adjustable gain value is based on a gain control signal;

b) converting the amplified received signal from analog to digital c) calculating an indicator of the received signal's strength;

d) generating an error signal based on the indicator and a predetermined reference power level;

e) if a magnitude of the error signal bears a first relationship to a predetermined threshold value, then varying the gain control signal as a function of a fine-gain constant and the error signal; and f) if the magnitude of the error signal bears a second relationship to the predetermined threshold value, then varying the gain control signal as a function of a coarse-gain constant and the error signal;

wherein the coarse-gain constant is larger than the fine-gain constant and the second relationship is complimentary to the first relationship.

2. The method according to claim 1, further comprising the steps of:

g) amplifying the error signal based on the fine-gain constant to generate a first signal;

h) amplifying the error signal based on the coarse-gain constant to generate a second signal; and wherein if the magnitude of the error signal bears the first relationship to the predetermined threshold value, then varying the gain control signal in proportion to the first signal; and if the magnitude of the error signal bears the second relationship to the predetermined threshold value, then varying the gain control signal in proportion to the second signal.

3. The method according to claim 2, wherein:
the step of varying the gain control signal in proportion to the first signal includes the steps of:
if the magnitude of the error signal bears the first relationship to the predetermined threshold value, connecting the first signal, if not already connected, to an input of a feedback filter and disconnecting the second signal, if already connected, from the input of the feedback filter, wherein the feedback filter includes an output that varies in proportion to the input, and
varying the gain control signal according to the output of the feedback filter; and
the step of varying the gain control signal in proportion to the second signal includes the steps of:
if the magnitude of the error signal bears the second relationship to the predetermined threshold value, connecting the second signal, if not already connected, to the input of the feedback filter and disconnecting the first signal, if already connected, from the input of the feedback filter, and
varying the gain control signal according to the output of the feedback filter.

4. The method according to claim 3, wherein the feedback filter comprises:
a delay circuit configured to delay the output of the feedback filter one clock period; and
a signal combiner configured to add a current input to the feedback filter to the delayed output.

5. The method according to claim 1, wherein the step of calculating the indicator includes the steps of:
c.1) generating an in-phase signal based on the amplified received signal;
c.2) converting the in-phase signal from analog to digital;
c.3) generating an out-of-phase signal based on the amplified received signal;
c.4) converting the out-of-phase signal from analog to digital;
c.5) calculating an in-phase signal power, wherein the in-phase signal power is substantially equal to the square of the converted in-phase signal averaged over a fraction of a spreading-symbol period;
c.6) calculating an out-of-phase signal power, wherein the out-of-phase signal power is substantially equal to the square of the converted out-of-phase signal averaged over the fraction of the spreading-symbol period; and
c.7) summing the in-phase signal power and the out-of-phase signal power to obtain the indicator.

6. The method according to claim 1, further comprising the steps of:
g) low pass filtering the indicator;
h) limiting the filtered indicator to be between a predetermined minimum value and a predetermined maximum value;
i) calculating a logarithm of the limited indicator; and
wherein generating of the error signal is based on the calculated logarithm of the limited indicator.

7. The method according to claim 1, further comprising the steps of:
g) calculating the exponential of the gain control signal;
h) converting the calculated exponential of the gain control signal from digital to analog; and
i) low pass filtering the converted gain control signal;
wherein the adjustable gain value of the variable amplifier is based on the low-pass-filtered, converted gain control signal.

8. The method according to claim 6, wherein the step of generating an error signal includes the steps of:
d.1) storing the predetermined reference power level; and
d.2) subtracting the logarithm of the limited indicator from the predetermined reference power level.

9. The method according to claim 1, wherein the first relationship corresponds to the magnitude of the error signal being less than or equal to the predetermined threshold value.

10. The method according to claim 1, wherein varying of the gain control signal is based on an amplified error signal that is generated by selectively connecting the error signal with only one of two signal multipliers to a feedback filter according to a magnitude of the error signal, wherein if the magnitude of the error signal bears the first relationship to the predetermined threshold value, the error signal is connected to a multiplier having the fine-gain constant outputting to the feedback filter and if the magnitude of the error signal bears the second relationship to the predetermined threshold value, the error signal is connected to a second multiplier having the coarse-gain constant outputting to the feedback filter.

11. The method according to claim 10, wherein varying of the gain control signal is based on the amplified error signal after being filtered by:
delaying the gain control signal; and
combining the amplified error signal with the delayed gain control signal.

12. A fast two-loop automatic gain control circuit for a receiver, comprising:
a receiver amplifier having at least a received signal and a gain control signal as separate inputs, wherein the receiver amplifier amplifies the received signal in proportion to an adjustable gain value controlled by the gain control signal;
a power meter configured to measure a received signal strength indicator associated with the amplified received signal;
a first signal combiner configured to generate an error signal, wherein the error signal is a function of a reference power level and the measured received signal strength indicator;
a feedback filter having as a first output the gain control signal input of the receiver amplifier;
a fine-gain loop, configured to receive, as input, the error signal and further configured to generate, a first signal for output to the feedback filter, the first signal being based on the error signal and a fine-gain constant;
a coarse-gain loop, configured to receive, as input, the error signal and further configured to generate a second signal for output to the feedback filter, the second signal being based on the error signal and a coarse-gain constant larger than the fine-gain constant; and
a selector circuit configured to selectively cause the fine and coarse loops to selectively apply only one of the loops at a time to drive the feedback filter, wherein
the fine-gain loop is selected when a magnitude of the error signal bears a first relationship to a predetermined threshold value such that the gain control signal varies according to the first signal;
the coarse-gain loop is selected when the magnitude of the error signal bears a second relationship to the predetermined threshold value such that the gain control signal varies according to the second signal; and the second relationship is complimentary to the first relationship.

13. The automatic gain control circuit according to claim 12, further comprising:
a quadrature down-converter configured to separate the amplified received signal into an in-phase signal and an out-of-phase signal;
a first analog-to-digital converter configured to convert the in-phase signal from analog to digital;
a second analog-to-digital converter configured to convert the out-of-phase signal from analog to digital; and
wherein the power meter comprises:
a first power calculator configured to output the square of the converted in-phase signal averaged over a fraction of a spreading-symbol period;
a second power calculator configured to output the square of the converted out-of-phase signal averaged over the fraction of the spreading-symbol period; and
a second signal combiner configured to sum the respective outputs from the first and second power calculators to obtain the received signal strength indicator.

14. The automatic gain control circuit according to claim 13, further comprising:
a power-shaping circuit connected between the power meter and the first signal combiner, comprising:
a low pass filter configured to receive the measured received signal strength indicator from the second signal combiner;
a gain limiter configured to receive a second output from the low pass filter and limit the value of the second output between a predetermined minimum and maximum value, and
a logarithm calculator, configured to calculate the logarithm of a third output from the gain limiter and provide the calculated logarithm to the first signal combiner.

15. The automatic gain control circuit according to claim 12, further comprising:
a magnitude calculator configured to calculate the magnitude of the error signal; and
a comparator configured to:
receive the calculated magnitude of the error signal, receive the predetermined threshold value, and
output a decision value to the signal selector, wherein the decision value indicates which of the first and the second relationships is satisfied by the calculated magnitude of the error signal.

16. The automatic gain control circuit according to claim 15, wherein the first relationship corresponds to the calculated magnitude of the error signal being less than or equal to the predetermined threshold value.

17. The automatic gain control circuit according to claim 12, wherein the feedback filter comprises:
a delay circuit configured to delay the output of the feedback filter one clock period; and
a third signal combiner configured to add a current input to the feedback filter to the delayed output.

18. The automatic gain control circuit according to claim 12, further comprising a control signal shaper connected between the output of the feedback filter and the gain control signal input of the receiver amplifier, wherein the control signal shaper comprises:
an exponential calculator configured to calculate the exponential of the output of the feedback filter;
a digital to analog converter configured to receive and convert the calculated exponential from digital to analog; and
a low pass filter configured to:
receive and filter the converted, calculated exponential, and
output the filtered, converted, calculated exponential to the gain control signal input of the receiver amplifier.

19. The automatic gain control circuit according to claim 12, wherein:
the fine-gain loop comprises the fine-gain amplified error signal;
the coarse-gain loop comprises the coarse-gain amplified error signal; and
the selector circuit comprises:
a first input connected with the output of the fine-gain loop;
a second input connected with the output of the coarse-gain loop; and
wherein the selector circuit is configured to:
output the fine-gain amplified error signal to the feedback filter only when the magnitude of the error signal bears the first relationship to the predetermined threshold value; and
output the coarse-gain amplified error signal to the feedback filter only when the magnitude of the error signal bears the second relationship to the predetermined threshold value.

20. A fast two-loop AGC circuit for use in a communications transceiver, comprising:
(a) a receiver configured to receive a first communications signal and to amplify the received signal with a variable amplifier, wherein the receiver further comprises:
(a)(1) a quadrature downconverter connected with the variable amplifier configured to generate an in-phase signal and an out-of-phase signal;
(a)(2) a first analog-to-digital converter configured to generate a converted in-phase signal by converting the in-phase signal from analog to digital;
(a)(3) a second analog-to-digital converter to generate a converted out-of-phase signal by converting the out-of-phase signal from analog to digital
(b) a transmitter configured to transmit a second communications signal; and
(c) an automatic gain control circuit configured to generate a control signal to vary the gain of the variable amplifier, wherein the automatic gain control circuit further comprises:
(c)(1) a first power meter configured to measure a first power averaged over a fractional spread-symbol period associated with the converted in-phase signal;
(c)(2) a second power meter configured to measure a second power averaged over the fractional spread-symbol period associated with the converted out-of-phase signal;
(c)(3) a composite power meter configured to combine the first and second power into a composite power as the received signal strength indicator;
(c)(4) a first signal combiner configured to generate an error signal, wherein the error signal is a function of both the received signal strength indicator and a reference power level;
(c)(5) a fine-gain feedback filter configured to output the control signal, wherein the control signal varies proportionally to the error signal and a fine-gain constant;
(c)(6) a coarse-gain feedback filter configured to output the control signal, wherein the control signal varies proportionally to the error signal and a coarse-gain constant, wherein the coarse-gain constant is larger than the fine-gain constant;

(c)(7) a selector circuit configured to:
select only the fine-gain feedback filter when the error signal bears a first relationship with a predetermined threshold value; and
select only the coarse-gain feedback filter when the error signal bears a second relationship with the predetermined threshold value; and wherein the second relationship is complimentary to the first relationship.

21. The transceiver according to claim 20, wherein the transceiver is located in a base station.

22. The transceiver according to claim 20, wherein the transceiver is located in a mobile station.

23. The transceiver according to claim 20, wherein both the transmitted and received signals are non-spread-spectrum signals.

24. The transceiver according to claim 23, wherein both the transmitted and received signals are orthogonal frequency division multiplexing (OFDM) signals.

25. An automatic gain control circuit for a receiver, comprising:

a receiver amplifier having at least a received signal and a gain control signal as separate inputs, wherein the receiver amplifier amplifies the received signal in proportion to an adjustable gain value controlled by the gain control signal;

a power meter configured to measure a power level associated with the amplified received signal;

a first signal combiner configured to generate an error signal, wherein the error signal is a function of a reference signal level and the measured power level;

a loopback filter for supplying the gain control signal input to control the adjustable gain value of the receiver amplifier;

a selective-gain loop, configured to receive the error signal as input, and further configured to selectively generate first and second signals as outputs for application to drive the loopback filter, wherein: the first signal is based on the error signal and a first gain constant, and the second signal is based on the error signal and a second gain constant larger than the first gain constant; and a control circuit coupled to control the selective operation of the selective-gain loop in response to a magnitude of the error signal, such that the selective-gain feedback loop outputs the first signal when the magnitude of the error signal bears a first relationship to a predetermined threshold value, and the selective-gain feedback loop outputs the second signal when the magnitude of the error signal bears a second relationship to the predetermined threshold value; and wherein the second relationship is complimentary to the first relationship.

26. An automatic gain control circuit for use with a digital receiver, the digital receiver including an amplifier having at least a received signal and a gain control signal as separate inputs, wherein the amplifier amplifies the received signal in proportion to an adjustable gain value controlled by the gain control signal and outputs an amplified signal for application to a digital to analog converter of the digital receiver, said automatic gain control circuit comprising:

a power meter for measuring a power level associated with the amplified received signal in response to a digitized output from the digital analog converter of the digital receiver;

a combiner for generating an error signal as a function of a reference signal level and the measured power level;

a selective-gain feedback loop for supplying the gain control signal input to control the adjustable gain value of the receiver amplifier, the selective-gain feedback loop being configured to:
receive the error signal as an input, and
selectively generate the gain control signal based on application of first and second gain constants to the error signal, the second gain constant being larger than the first gain constant; and a control circuit coupled to control selective operation of the selective-gain feedback loop in response to a magnitude of the error signal, such that the selective-gain feedback loop applies the first gain constant when the magnitude of the error signal bears a first relationship to a predetermined threshold value, and the selective-gain feedback loop applies the second gain constant when the magnitude of the error signal bears a second relationship to the predetermined threshold value; wherein the second relationship is complimentary to the first relationship.

* * * * *